United States Patent [19]

Trovato et al.

[11] Patent Number: 5,083,256

[45] Date of Patent: Jan. 21, 1992

[54] PATH PLANNING WITH TRANSITION CHANGES

[75] Inventors: Karen I. Trovato, Putnam Valley; Leendert Dorst, Yorktown Heights, both of N.Y.

[73] Assignee: North American Philips Corporation, New York, N.Y.

[21] Appl. No.: 422,930

[22] Filed: Oct. 17, 1989

Related U.S. Application Data

[63] Continuation-in-part of Ser. No. 166,599, Mar. 9, 1988, Pat. No. 4,949,277.

[51] Int. Cl.⁵ ............... G06F 15/46; G06F 15/48; G06F 15/18

[52] U.S. Cl. ................. 364/148; 364/424.02; 364/436; 364/461

[58] Field of Search ............ 364/513, 148, 424.02, 364/436–438, 444, 461, 167.01, 200 MS File, 474.2

[56] References Cited

U.S. PATENT DOCUMENTS

| | | | |
|---|---|---|---|
| 4,481,568 | 11/1984 | Inaba et al. | 364/513 X |
| 4,482,968 | 11/1984 | Inaba et al. | 364/474.2 X |
| 4,674,048 | 6/1987 | Okumura | 364/424.02 |
| 4,764,873 | 8/1988 | Libby | 364/461 |

Primary Examiner—Joseph Ruggiero
Attorney, Agent, or Firm—Anne E. Barschall

[57] ABSTRACT

A configuration space is used for path planning and for controlling the motion of an object. The configuration space includes states which contain cost to goal and direction arrow values. These values indicate a path or absence of a path from the states to at least one goal state. The configuration space is differentially updated after a cost to goal or direction arrow value is changed.

2 Claims, 12 Drawing Sheets

PATH PLANNING WITH TRANSITION CHANGES

RELATED APPLICATIONS

The present application is a continuation-in-part of U.S. application Ser. No. 166,599 mailed Mar. 9, 1988, now U.S. Pat. No. 4,949,277, which is incorporated herein by reference.

BACKGROUND OF THE INVENTION

1. Field of the Invention

The invention relates to path planning and in particular to controlling the motion of an object in a changing environment.

2. Related Art

The field of path planning is one with many applications. The most common application is to controlling robots. Other applications include electronic maps, traffic control, emergency vehicle control, and emergency exit systems and vehicle maneuvering.

The path planning problem, as applied to robots, typically involves getting a robot from a start point to a goal point while avoiding obstacles. Automating multidimensional path planning for robots is one of the great historical problems of robotics.

The present invention is an improvement on the invention disclosed U.S. patent application Ser. No. 123,502, which is incorporated herein by reference as background material. That application disclosed, amongst other things, propagating cost waves through a configuration space by budding, using a space-variant metric.

After budding, some aspect of the configuration space may change, for instance, if an obstacle is removed or a goal added. In such a case, it may be inefficient to bud the entire configuration space again because only a small part of the configuration space may be affected.

T. Boult, "Updating Distance Maps when Objects Move", SPIE Vol. 852 Mobile Robots II (1987), pp. 232-237 deals with updating portions of a configuration space when objects move. This paper, however, does not discuss changing configuration spaces in the context of budding or in the context of space variant metrics. This paper also does not discuss the details of differentially changing a planned path when a transition cost changes.

SUMMARY OF THE INVENTION

It is an object of the invention to differentially change a planned path when a transition cost changes or when a transition is added or removed.

BRIEF DESCRIPTION OF THE DRAWING

The invention will now be described by way of non-limitative example with reference to the following drawings.

DETAILED DESCRIPTION OF THE PREFERRED EMBODIMENTS

Overview of the Method

Figure 1:
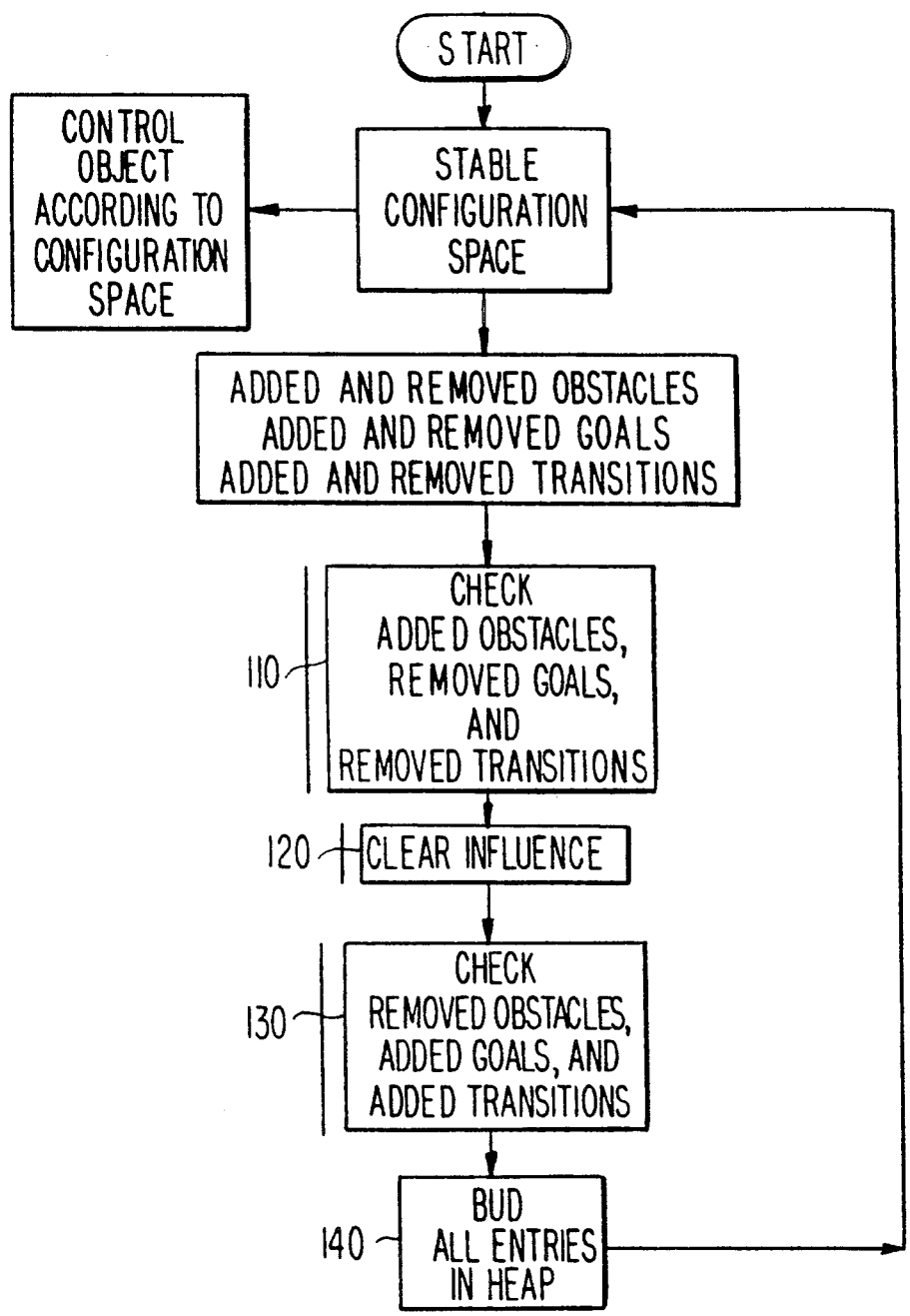
FIG. 1 is a general flow-chart of differential budding with changes in transitions.

FIG. 1 gives a general overview of steps used in "differential budding", a method for regenerating a configuration space with changes in obstacles and goals. The resulting configuration space provides information necessary to generate a series of set points to be followed for an optimal path.

In box 100, a configuration space, filled with direction arrows and costs_to_goal, is assumed. Information about changed goal and obstacle states is also assumed to be provided. These states are already transformed from task space to configuration space. It should be noted that the method will work if the configuration space is merely initialized, with UNCOSTED in each cost_to_goal, and no direction arrows.

In box 110, information about newly added obstacle states and newly removed goal states is used to initialize the corresponding states in configuration space.

In box 120, all states 'influenced' by the added obstacle and removed goal states are initialized to have UNCOSTED values and no direction arrows. 'Influenced' neighbors are those that are on paths that point to or through these added obstacle or removed goal states. The 'perimeter' of states around this region is obtained and added to the heap for later 'budding'.

In box 130, information about newly removed obstacle states and newly added goal states is used to initialize the corresponding states in configuration space. The heap is set up so that 'budding' can take place.

In box 140, the states on the heap accumulated as a result of boxes 110, 120, and 130 are 'budded' resulting in a stable (valid) configuration space. Given a starting state, an optimal path of set points can be read out by following the direction arrows in configuration space to the goal state.

Two special structures are used for efficiency: a sifting heap, and a sifting array. The 'sifting heap' is a regular heap except that it keeps at most one copy of a tuple (state) in the heap even though many requests to add extra copies may be made. Whenever the word "heap" is used herein, a "sifting heap" is intended. The 'sifting array' (used to store unique states of the perimeter) is similarly a regular array except that it keeps at most one copy of a tuple (state). Some of the arrays referred to herein are sifting and some are not. In both cases, sifting is achieved by maintaining flags in each state of the configuration space that report if a state is in the heap or in the perimeter array. Then all that is needed when adding or removing states from the heap or perimeter is to modify these flags correctly.

Check added obstacles and removed goals.

Figure 2:
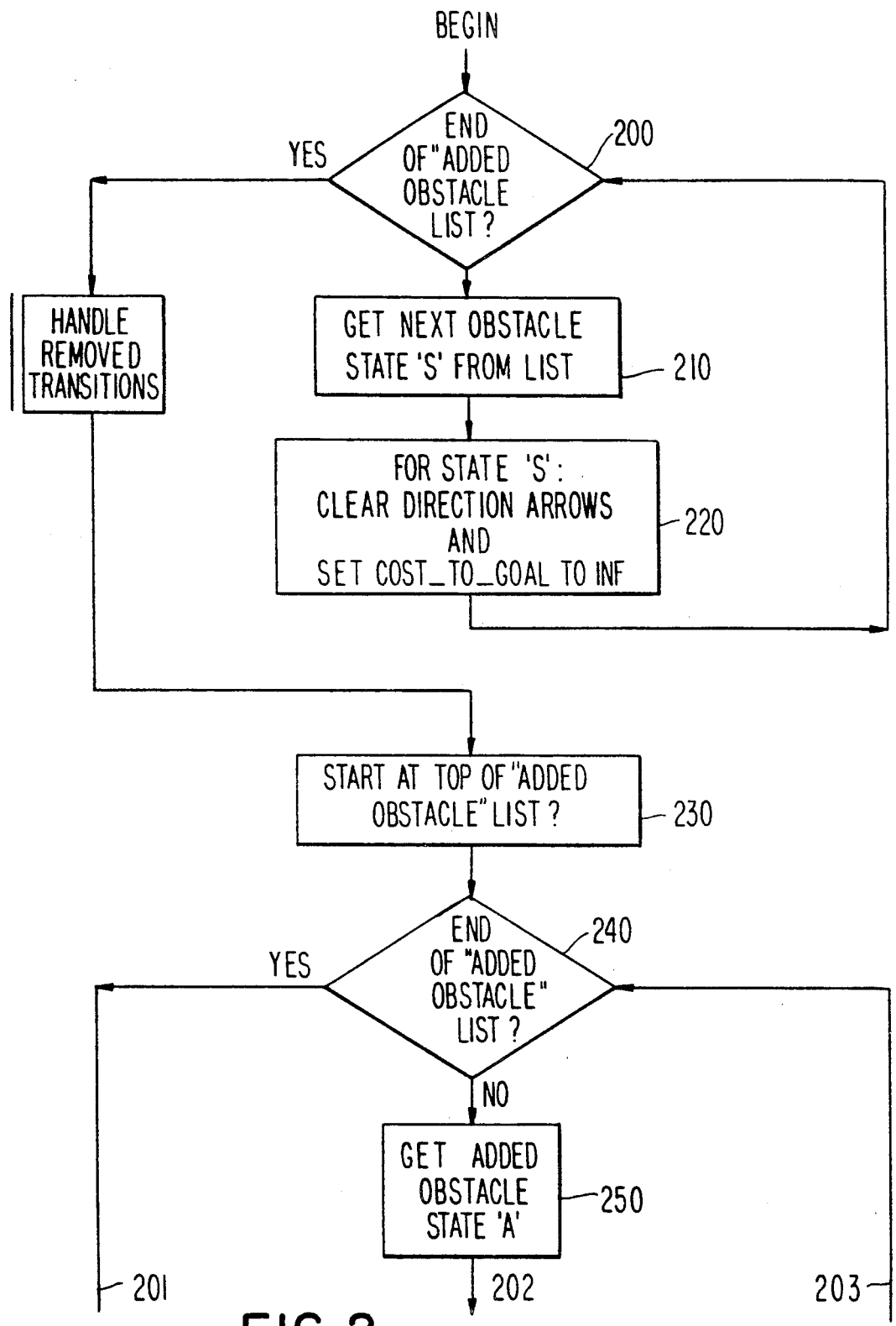
FIGS. 2 and 3 are flow charts giving more details of box 110 of FIG. 1.
Figure 3:
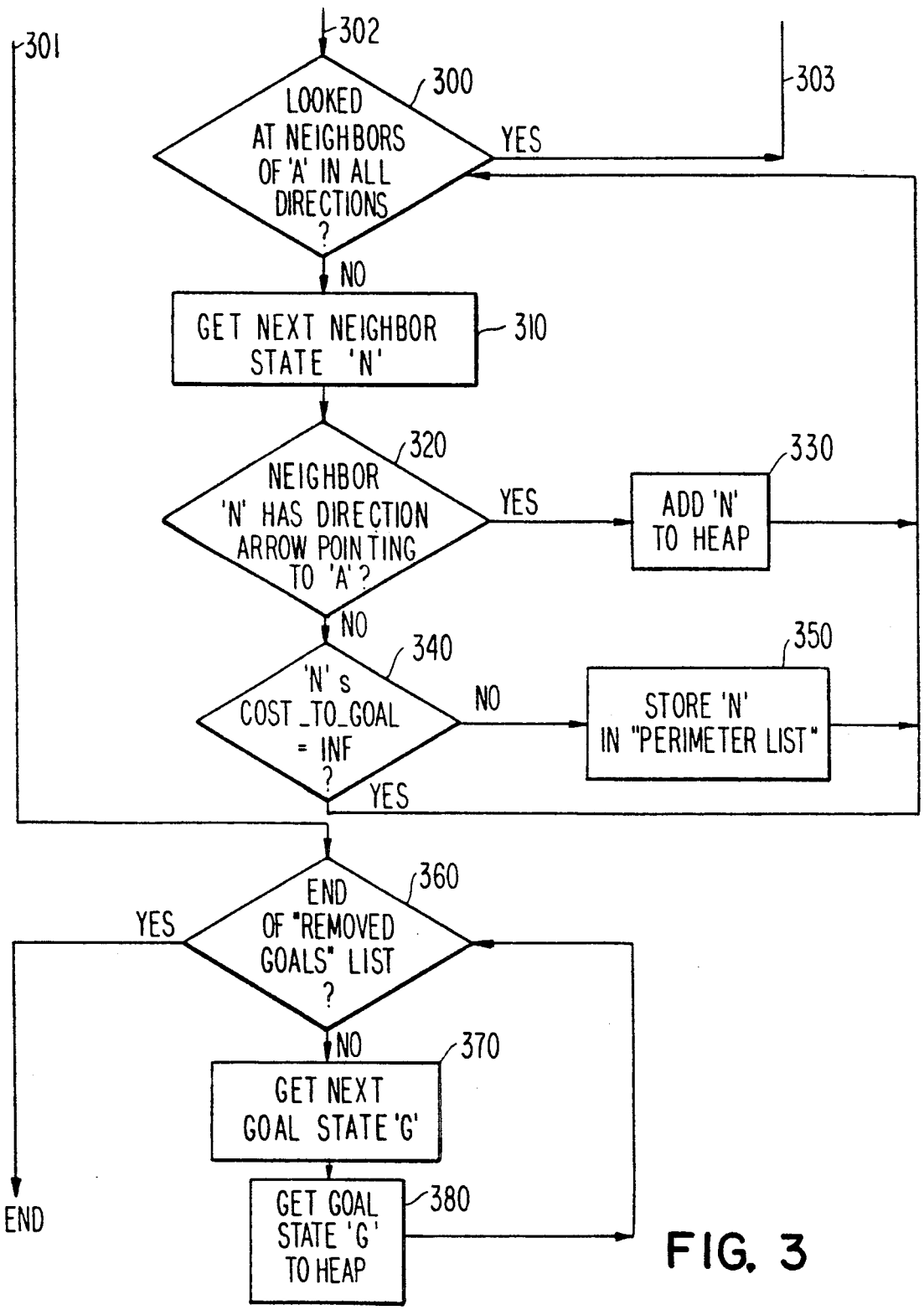

The method in box 110 is detailed by the flowchart of FIG. 2 and FIG. 3. The method of box 120 is detailed by the flowchart in FIG. 4 and FIG. 5. The method of box 130 is detailed by the flowchart of FIG. 6 and FIG. 7.

The 'check added obstacles and removed goals' method of box 110 includes three main parts.

The first part is shown in boxes 200, 210, and 220. Box 200 tests whether the end of the "added obstacle" list has been reached. If the result of the test in box 200 is "Yes", control passes to box 230 via box 260. If the result of the test in box 200 is "No", control passes to box 210. Box 210 gets the next obstacle state 'S' from the added obstacle list. Box 220 then clears the direction arrows field and sets the cost_to_goal field to INF in the state 'S'. After box 220, control is returned to box 200.

Boxes 200, 210, and 220 thus constitute a loop which initializes each 'added obstacle' state ('S') in configuration space to have no direction arrows and an INF (INFINITE) cost_to_goal.

The second part of the "check added obstacles and removed goals" method of box 110 is shown in boxes 230, 240 and 250 of FIG. 2, and boxes 300, 310, 320, 330, 340, and 350 of FIG. 3. It should also be noted that line 201 of FIG. 2 connects to line 301 of FIG. 3; line 202 of FIG. 2 connects to line 302 of FIG. 3; and line 203 of FIG. 2 connects to line 303 of FIG. 3.

In this second part of box 110, the 'front edge' of the obstacle and the 'back edge' of the added obstacle are obtained. The 'front edge' contains those neighbor states that are on the goal side' of the added obstacle. These states are neighbors of the obstacle region, have cost values other than INFINITY or UNCOSTED, and are not pointing toward any of the obstacle states. The 'back edge' contains those neighbor states that are not on the front edge. These states have direction arrows that point into the added obstacle.

Box 240 signifies a test for the end of the "added obstacle" list. If the end has been reached, control passes via line 201/301 to box 360. If the end has not been reached, control passes to box 250, where an added obstacle 'A' is retrieved.

Then at box 300, it is determined whether all of the neighbor states 'N' of the obstacle state 'A' have been considered. If all of the neighbor states 'N' have been considered, control returns via line 303/203 to box 240. If a neighbor state 'N' has not been considered, control passes to box 310, where that state 'N' is retrieved.

Box 320 indicates a test of whether the state 'N' contains a direction arrow that points to 'A'. If state 'N' does not contain such a direction arrow, control passes to box 340. If state 'N' does contain such a direction arrow, the state 'N' is added to the heap at box 330. If the state 'N' is added to the heap at box 330, 'N' is considered to be part of the 'back edge' of the added obstacle. After box 330, control returns to box 300.

In box 340, 'N' is tested for whether its cost_to_goal field contains INF. If 'N' does have a cost_to_goal of INF, control is returned to box 300. If 'N' has a cost_to_goal other than INF, it is added to the 'perimeter list' at box 350, and is considered part of the 'front edge' of the obstacle.

The third part of the "check added obstacles and removed goals" method of box 110 is shown in boxes 360, 370 and 380 of FIG. 3. These three boxes form a loop. In box 360, it is determined whether the end of the "removed goals" list has been reached. If the end has been reached, the "check added obstacles and removed goals" method is complete. If the end has not been reached, the next goal state 'G' is retrieved at box 370. This goal state 'G' is then added to the heap at box 380 and control is returned to box 360. Thus, in this loop, each of the removed goal states in the 'removed goal list' is added to the heap.

Clear influence.

The 'clear influence' method of box 120 includes two main parts. The first part determines the 'perimeter of influence' due to the newly added obstacle and removed goal states, and the second part takes the perimeter and puts it into the heap.

Figure 4:
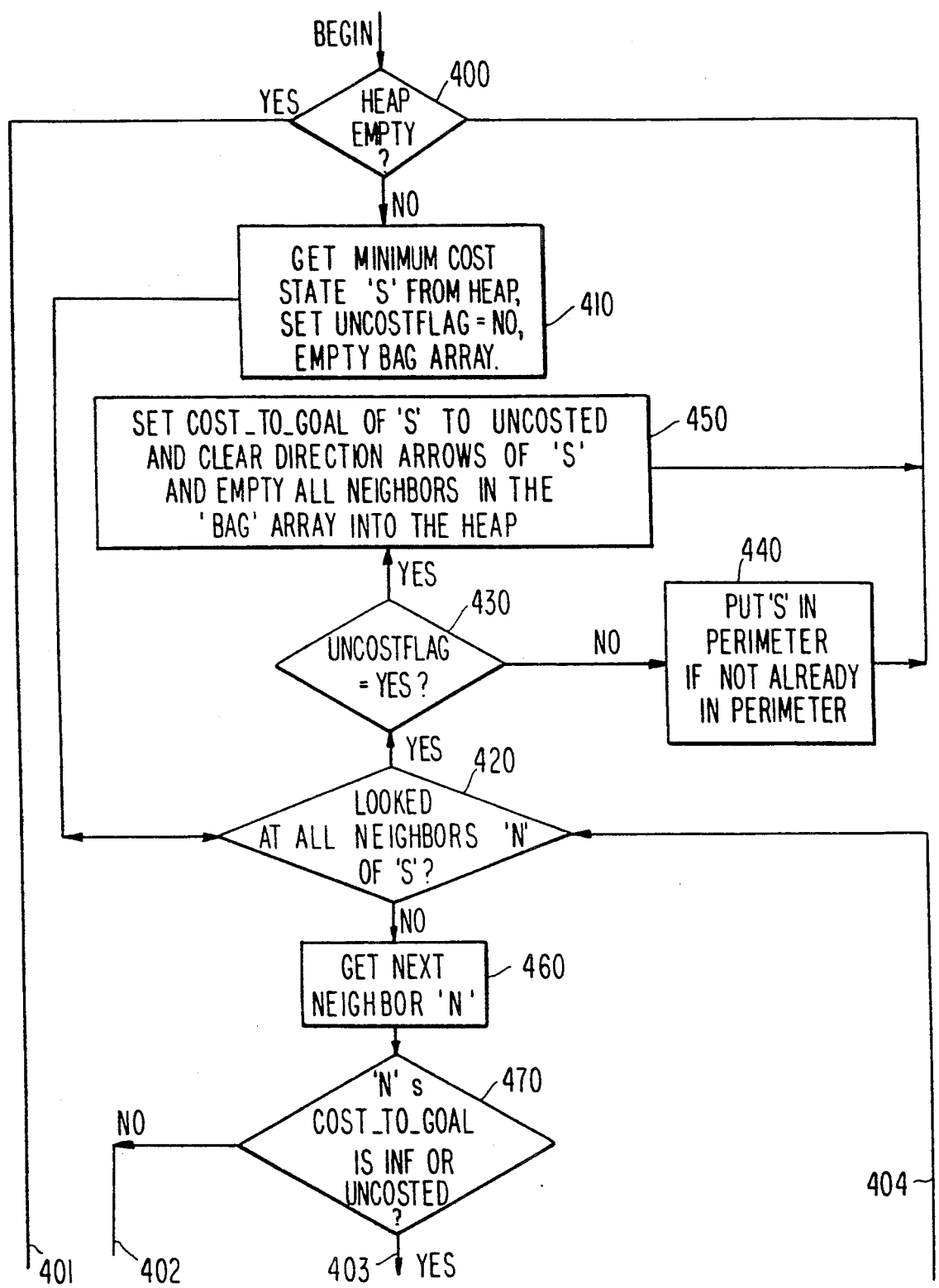
FIGS. 4 and 5 are flow charts giving more details of box 120 of FIG. 1.
Figure 5:
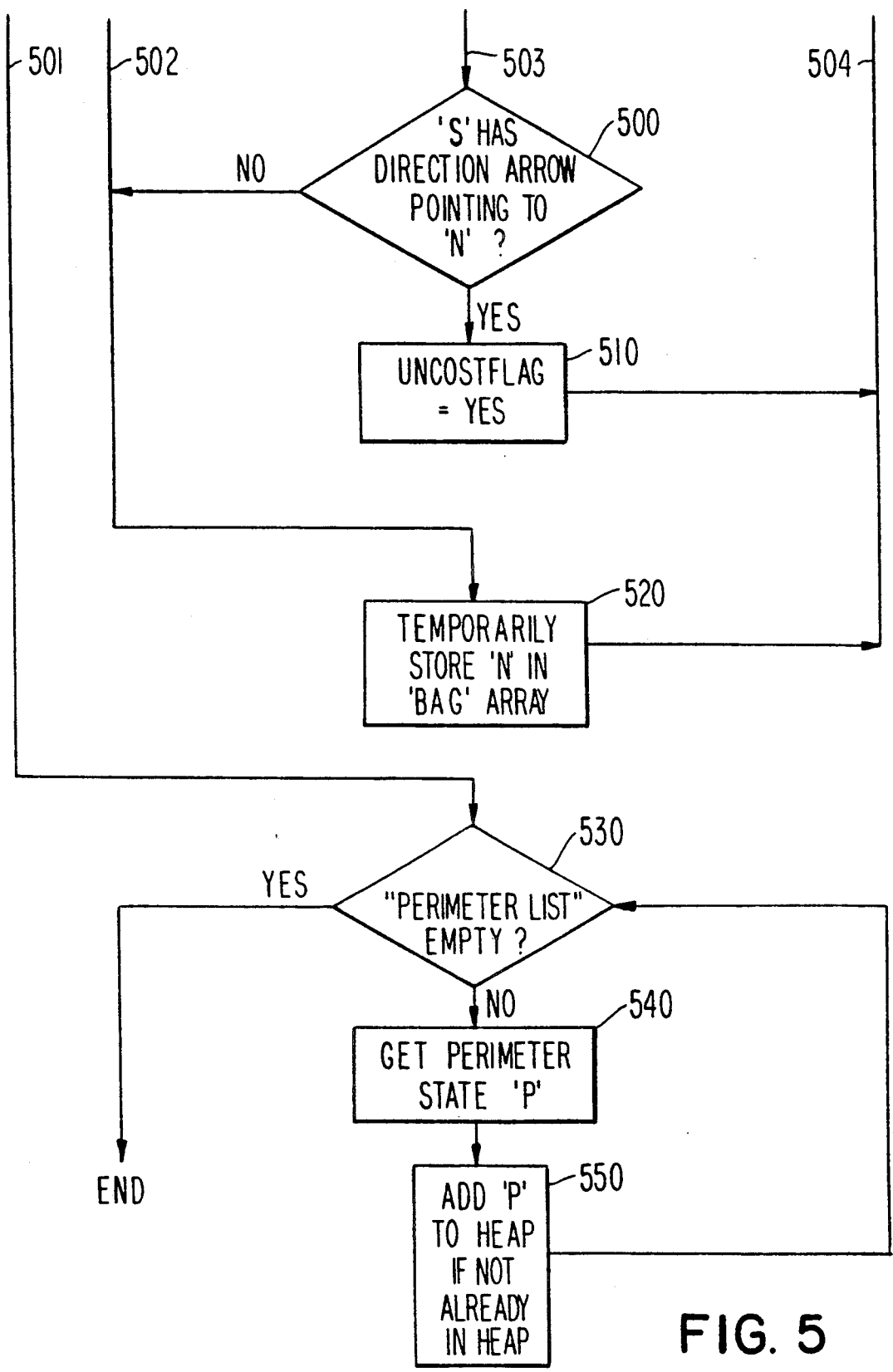

The first part of the "clear influence" method of box 120 is shown in boxes 400, 410 420, 430, 440, 450, 460 and 470 of FIG. 4, and boxes 500, 510 and 520 of FIG. 5. It should be noted that line 401 of FIG. 4 connects to line 501 of FIG. 5, line 402 of FIG. 4 connects to line 502 of FIG. 5, line 403 of FIG. 4 connects to line 503 of FIG. 5, and line 404 of FIG. 4 connects to line 504 of FIG. 5.

At the beginning of the 'clear influence' method, the heap consists of neighbor states at the back edge of any added obstacles and any removed goal states. At box 400, the heap is tested to see if it is empty. If the heap is empty control passes via line 401/501 to box 530.

If the heap is not empty, then, at box 410, a minimum cost state 'S' is retrieved from the heap and and a variable, uncostflag, corresponding to 'S' is set to "NO". At box 420, it is then determined whether all neighbors, 'N', of 'S' have been considered. If all the neighbors have been considered, control passes to box 460.

If all of the neighbors have not been considered, the variable uncostflag is tested at box 430. If uncostflag has a value "No" then, at box 440, 'S' is added to the perimeter, if 'S' has not already been added to the perimeter. If uncostflag has a value "Yes", then, at box 450, the cost_to_goal field of 'S' is set to UNCOSTED; the direction arrows field of 'S' is cleared; and all neighbor from the 'Bag' array are emptied into the heap which sifts them, i.e. it does not store any duplicate states.

At box 460 a next neighbor 'N' is retrieved. At box 470 the cost_to_goal field of 'N' is tested to see if it is either INF or UNCOSTED. If it is neither, control passes via line 402/502 to box 520. If it is either INF or uncosted, control passes via line 403/503 to box 500.

At box 500, 'S' is checked to see if it has a direction arrow pointing to 'N'. If not, control passes to box 520. If so, the uncostflag associated with 'S' is set to "YES".

In box 520 the neighbor 'N' is temporarily stored in the Bag array. Control then returns via line 504/404 to box 420.

Thus, during the first part of the "clear influence" method of box 120, each state 'S' in the heap, that points to any neighbor 'N' that has a cost_to_goal that is either INFINITE or UNCOSTED is identified. Such a state 'S' must therefore have been 'connected' via direction arrows to the back of a new obstacle state or to a removed goal state. Any neighbor that is not INFINITE or UNCOSTED is a candidate for expanding the search and is temporarily stored in the 'Bag'. The 'Bag' is a standard array containing states. After all neighbors of 'S' are examined, if 'S' is connected, then all neighbors of 'S' that are in the 'Bag' are added ("emptied") to the heap, which sifts them, and 'S' is reinitialized to have cost_to_goal of UNCOSTED and no direction arrows. If 'S' is not connected, 'No' branch from box 430, then 'S' must be a member of the 'perimeter' and the neighbors that are in the 'Bag' are NOT added to the heap.

The second part of the "clear influence" method of box 120 is shown in boxes 530, 540, and 550 of FIG. 5. At box 530, the perimeter list, stored in a sifting array, is checked to see if it is empty. If so, the clear influence method ends. If not, a perimeter state 'P' is retrieved 540 and added 550 to the heap, if not already in the heap. After box 550, control is returned to box 530. This second part of box 120 thus reads the states in the "perimeter list" and stores them in the heap.

Thus the perimeter list can be said to surround an influenced or "affected region" of the configuration space, and this terminology has been used herein. The term "influenced" is used herein particularly to refer to the "clear influence" step 120 and is distinguished from the term affected, which is used more broadly as explained below. However, this terminology is not meant to imply that the surrounded region is contains the only states which may be changed as a result of differential budding. States on or outside the perimeter may have their cost_to_goal or direction arrows values changed as a result of budding the heap in box 140 of FIG. 1.

Check removed obstacles and added goals.

The 'check removed obstacles and added goals' method of box 130 has three main parts.

The first part is shown in boxes 600, 610 and 620. At box 600 it is determined whether the end of the 'removed obstacle' list has been reached. If the end has been reached, control passes to box 630. If the end has not been reached, a next obstacle state, 'S', is retrieved from the list at box 610. In this state, 'S', the direction arrows field is cleared and the cost_to_goal field is set to UNCOSTED. This first part is, then, a loop which initializes each 'removed obstacle' state in configuration space to have no direction arrows and an UNCOSTED cost_to_goal. These are appropriate values, since these now unoccupied (removed) obstacle states have no presumed costs or arrows. These removed obstacle states can be said to be the region affected by the obstacle removal, and this terminology is used herein. However, it should be noted that states outside this "affected region" may still have their cost_to_goal and direction arrows values changed as a result of budding in box 140. The states surrounding the removed obstacle can be said to be the perimeter, but they require a less sophisticated treatment than the perimeter of the removed goals and added obstacles.

Figure 6:
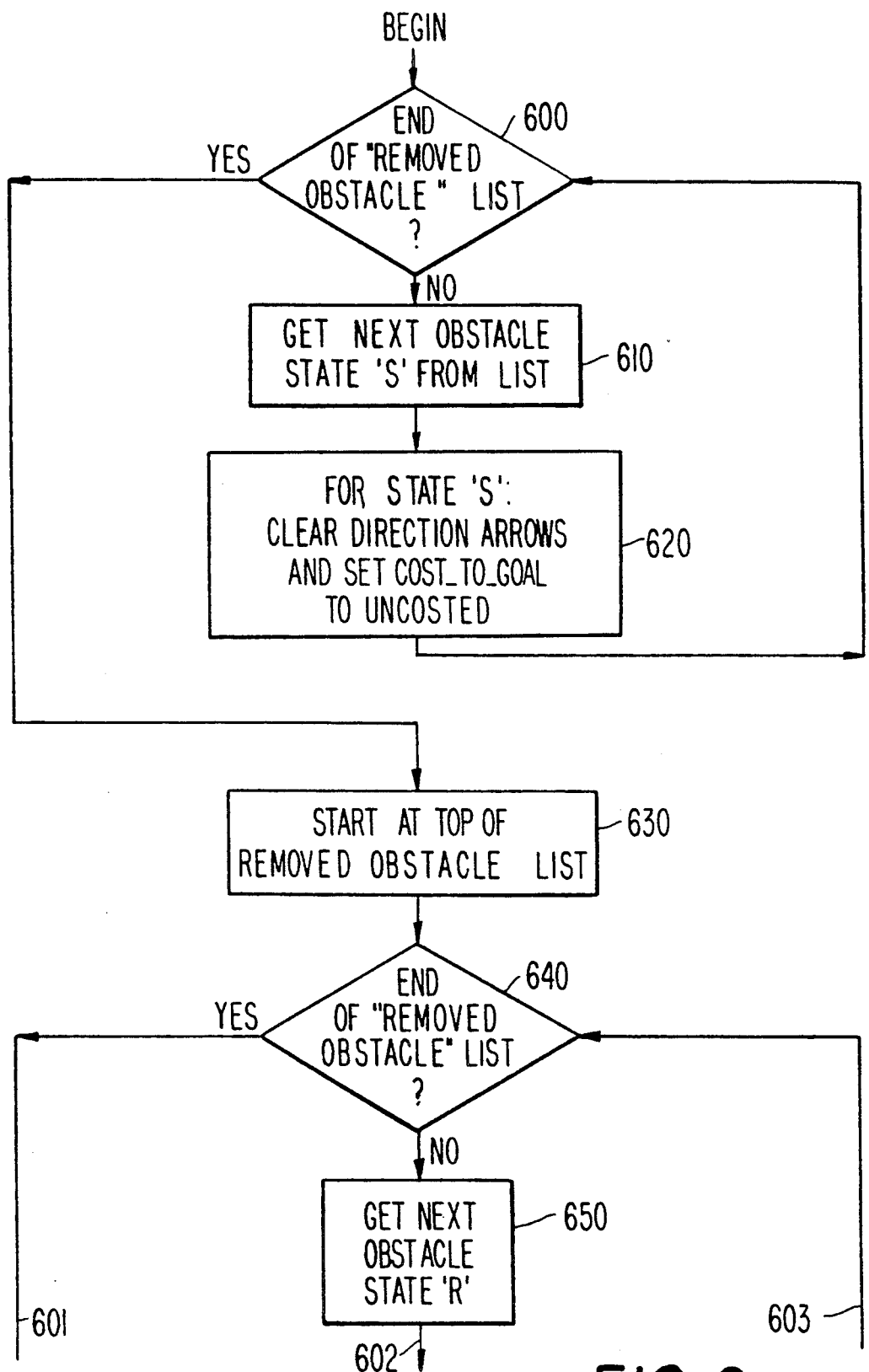
FIGS. 6 and 7 are flow charts giving more details of box 130 of FIG. 1.
Figure 7:
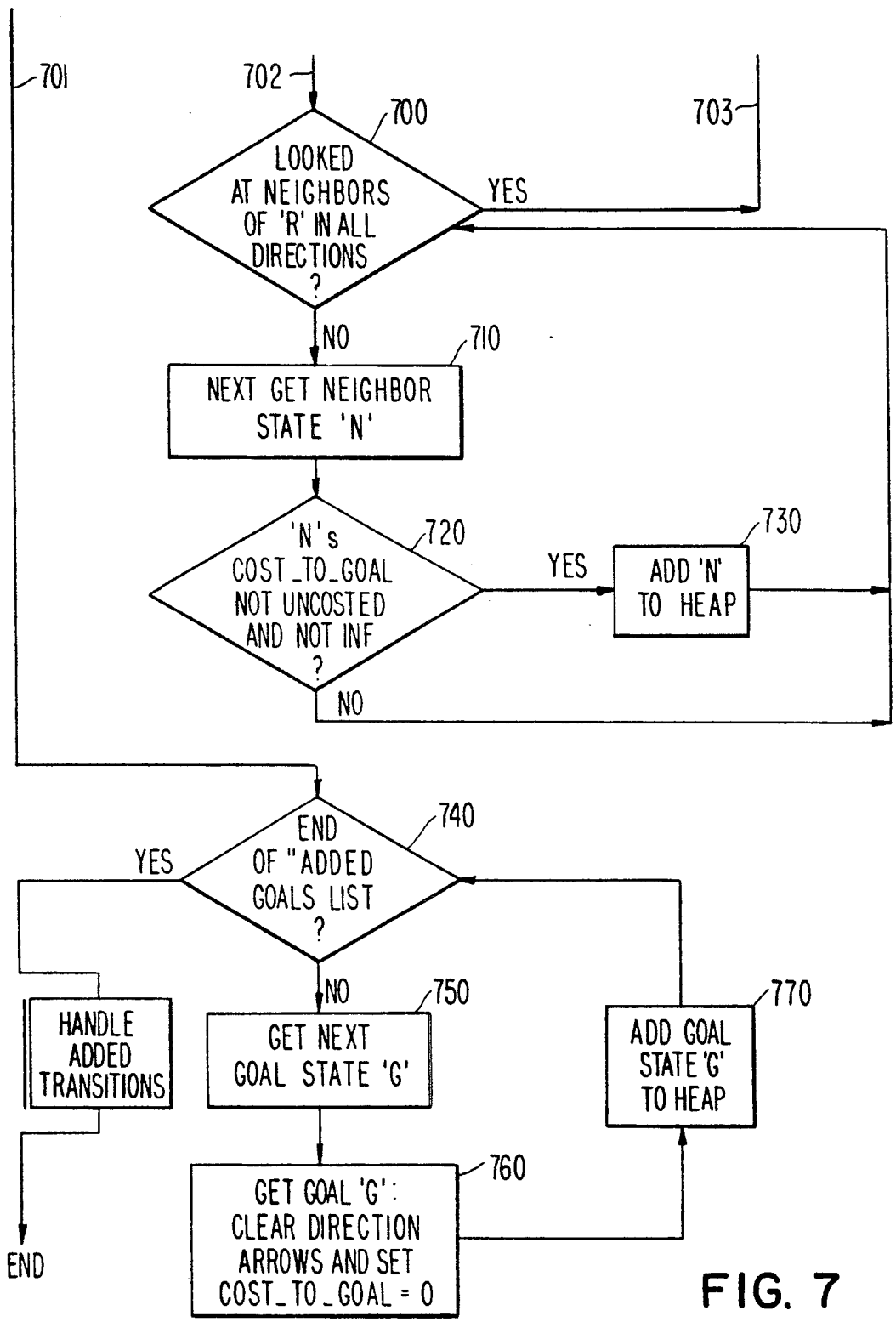

The second part of box 130 is shown in boxes 630, 640 and 650 o FIG. 6 and boxes 700, 710, 720, and 730 of FIG. 7. It should also be noted that line 601 of FIG. 6 connects to line 701 of FIG. 7, line 602 of FIG. 6 connects to line 702 of FIG. 7, and line 603 of FIG. 6 connects to line 703 of FIG. 7.

This second part of box 130 starts at the top of the removed obstacle list, at 630. A test is performed at 640, as in box 600, to determine whether the end of the "removed obstacle" list has been reached. If the end has been reached, control passes via line 601/701 to box 740. If the end has not been reached, a next obstacle state 'R' is retrieved at 650. Then, in box 700, it is determined whether all neighbors of 'R' have been considered. If so, control is passed via lie 703/603 to box 640. If not, a next neighbor state 'N' of 'R' is retrieved at 710. If 'N' has a cost-to goal field which has a value of UNCOSTED or INF, then control is returned to box 700. If 'N' has a cost_to_goal field which is not UNCOSTED and not INF, then 'N' is added to the heap at 730.

Thus, in this second part of box 130, all neighbors of a removed obstacle state that have a cost_to_goal other than 'INFINITY' or 'UNCOSTED' are added to the heap, which sifts them. These states together form an edge that is adjacent to the removed obstacle. These neighboring states will help (via the 'budding' mechanism of box 140) to fill in the vacated area where the 'removed obstacle' states reside.

The third part of box 130 is shown in boxes 740, 750, 760, and 770 of FIG. 7. At box 740, a test is performed to determine if the end of the "added goals" list has been reached. If the end has been reached, the 'check removed obstacles and added goals' method passes via box 780 and terminates. If the the end has not been reached, a next goal state 'G' is retrieved at 750. At 760, for the goal 'G', the direction arrows field is cleared and the cost_to_goal field is set to zero. Then, at 770, the goal 'G' is added to the heap and control is returned to box 740.

Thus, this third part of box 130 is a loop which takes each newly added goal state from the "added goals" list, clears the direction arrows, sets the cost_to_goal to zero, and adds each goal state to the heap. Thus the added goal states are both the "affected region" and the perimeter as that terminology is used herein. However, it should be noted that states outside this "affected region" may still have their cost_to_goal and direction arrows values changed as a result of budding in box 140.

In summary, then, the "affected region" as that term is used herein means states that have been cleared as part of the clear influence step 120, and states corresponding to removed obstacles and added goal states which are "influenced" are the ones cleared during the clear influence step 120.

Transition Cost changes

Figure 10:
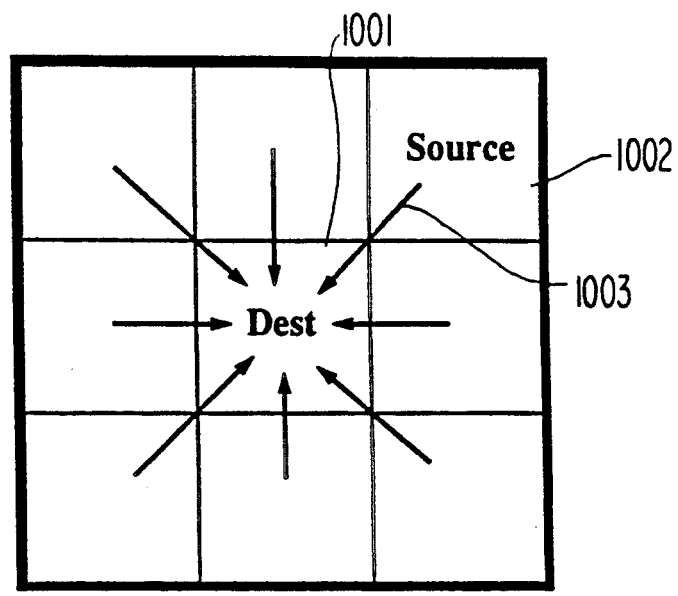
FIG. 10 is a sample neighborhood of transitions.
Figure 13:
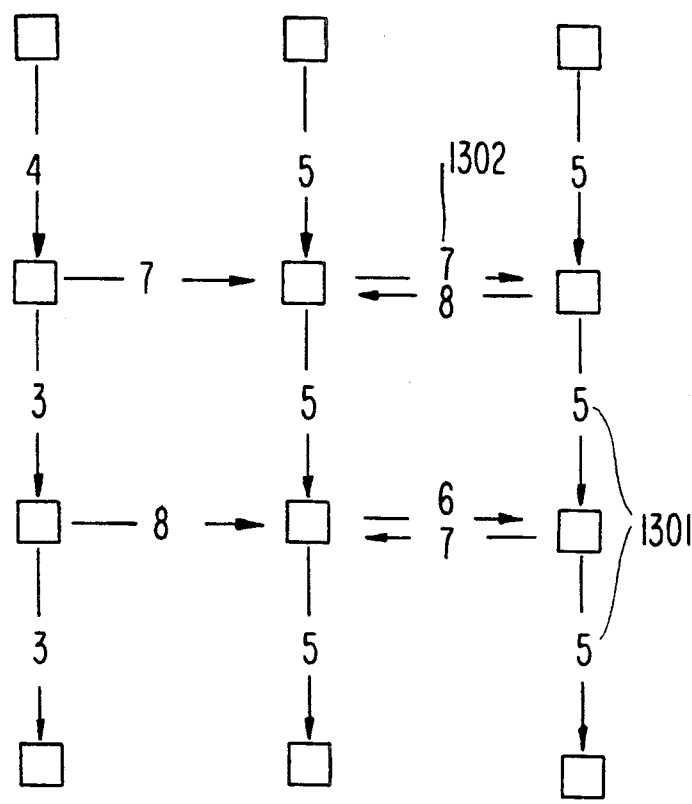
FIG. 13 shows a sample neighborhood with transition costs.

As used herein, the term 'transition' means a permissible movement from one state to a neighboring state. FIG. 10 illustrates a sample set of transitions The states at either end of a transition are defined as follows' The 'destination state' 1001 of a transition is located at the arrow head end of the transition. The 'source state' 1002 of a transition is located at the tail of the arrow of the transition. The transition has an associated cost. This cost is determined by the "metric" measure from the source to the destination. Even though there may exist a transition (and cost) from a source to a destination, this does not imply that there is a transition from destination to source. If it exists, it does not have to have the same cost. For example, if we consider a grid of streets, some streets may run faster in one direction than the other and some streets may be one way. FIG. 13 illustrates a configuration space for a grid of streets. In this figure, each street corner is considered a state represented by a square. There are one way streets 1301, and two way streets 1302. The time to travel on a street is at least partially determined by the number of potholes in that direction. More potholes would be one of the factors contributing to higher cost. If a new pothole is formed on a street, or a pothole is filled in, a change in transition cost would result. Costs associated with allowed transitions are given as numbers on arrows in the figure.

There are two categories of transition cost change. Transitions that are newly added or have decreased cost are treated differently from removed transitions or those with increased cost. If a transition is added or has decreased cost, then new opportunities for a lower cost solution may exist. If a transition is deleted or has an increased cost, then connections that used to depend on that transition will have to be re-evaluated, and may cause higher cost solutions in the configuration space.

The heap structure in differential budding always contains STATES. To handle the changes (additions and deletions) of TRANSITIONS, transition changes are cast into analogous state changes. The addition of a transition can be implemented in the mechanism for adding a goal state and removing an obstacle state. The addition of a transition can be implemented in the mechanism for removing a goal state and adding an obstacle state. A transition might be removed from the configuration space, for instance, when it was discovered experimentally that a robot was defective in certain movements and that transitions corresponding to those certain movements should not be considered.

Figure 8:
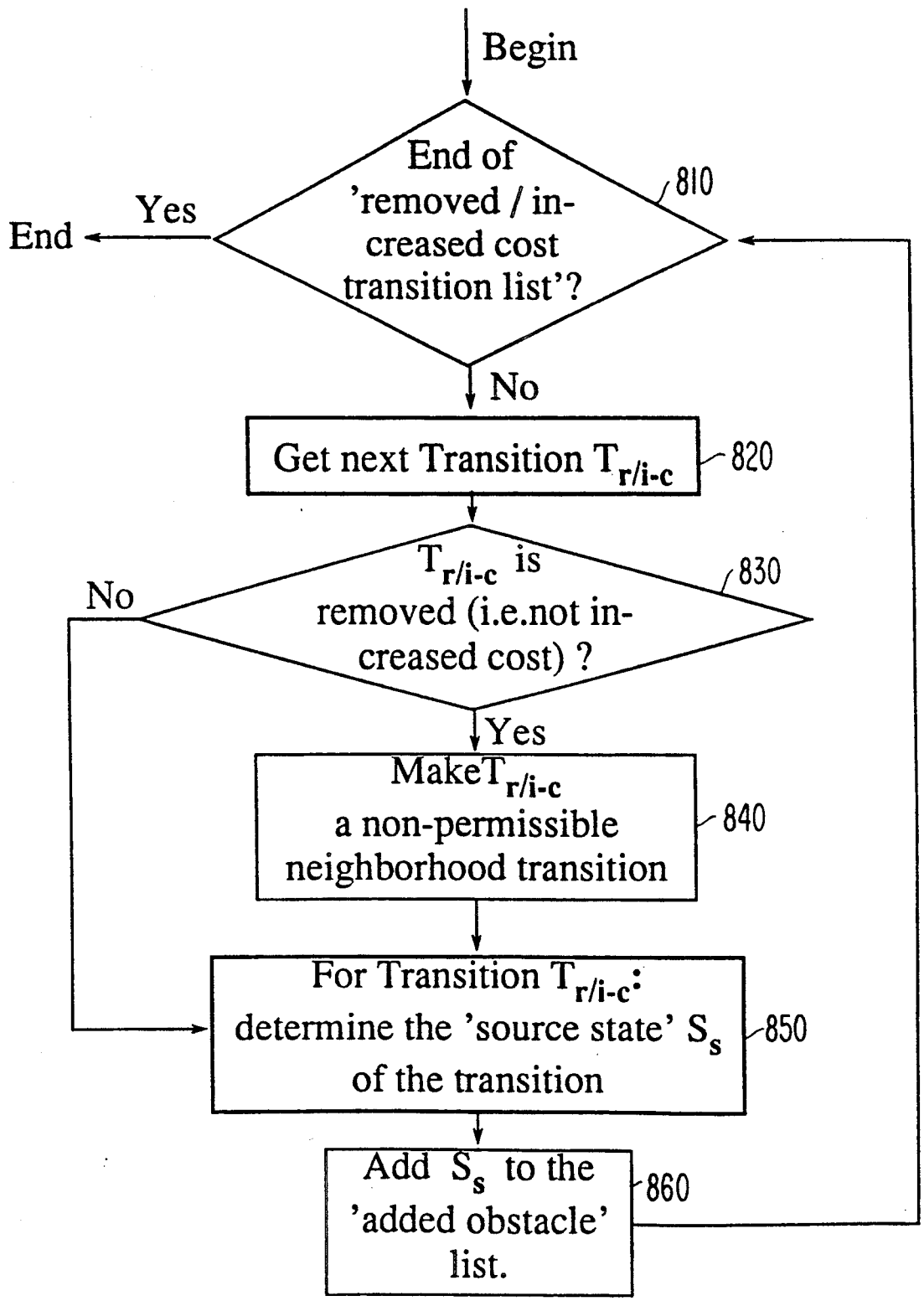
FIG. 8 is a flow chart giving more details of box 260 from FIG. 2.

FIG. 8 gives more details of box 260 of FIG. 2, in other words of how to handle removed transitions The adaptation of FIG. 8 occurs after the 'added obstacles' (if any) are initialized with infinite coast and cleared of arrows, but before a forward perimeter and heap are determined. In box 810, the method tests whether the end of the 'removed/increased cost transition list' has been reached. Such a list may be formed, in the case of FIG. 13, from condition changes reported by road users. If the end of the list has not been reached, the method at box 820 gets the next transition $T_{r/i-c}$ from the 'removed/increased cost transition list'. In box 830, the method tests whether $T_{r/i-c}$ is removed, i.e. not increased in cost. If the result of the test of box 830 is positive, in box 840 $T_{r/i-c}$ is made a non-permissible neighborhood transition. In other words, the direction_arrows value of the source state, which formerly indicated this transition was allowable, is removed. After box 840, the source state $S_s$ is determined for transition $T_{r/i-c}$ at box 850. Thereafter, source $S_s$ is added to the "added obstacle" list in box 860 and control is returned to box 810. If the result of the test of box 830 is negative, control passes directly from box 830 to box 850. If the result of the test of box 810 is positive, box 260 of FIG. 2 ends.

The addition of an obstacle state in the differential budding method indirectly removes transitions. When an obstacle is added, previously permissible transitions between the obstacle states and obstacle neighbors become illegal and the dependent transitions in the configuration space are removed by the clear-influence mechanism.

However, a transition is explicitly removed when a previously allowed movement a source and destination state is restricted or when the cost of an existing transition is increased. Both of these situations follow the method of FIG. 8.

Figure 9:
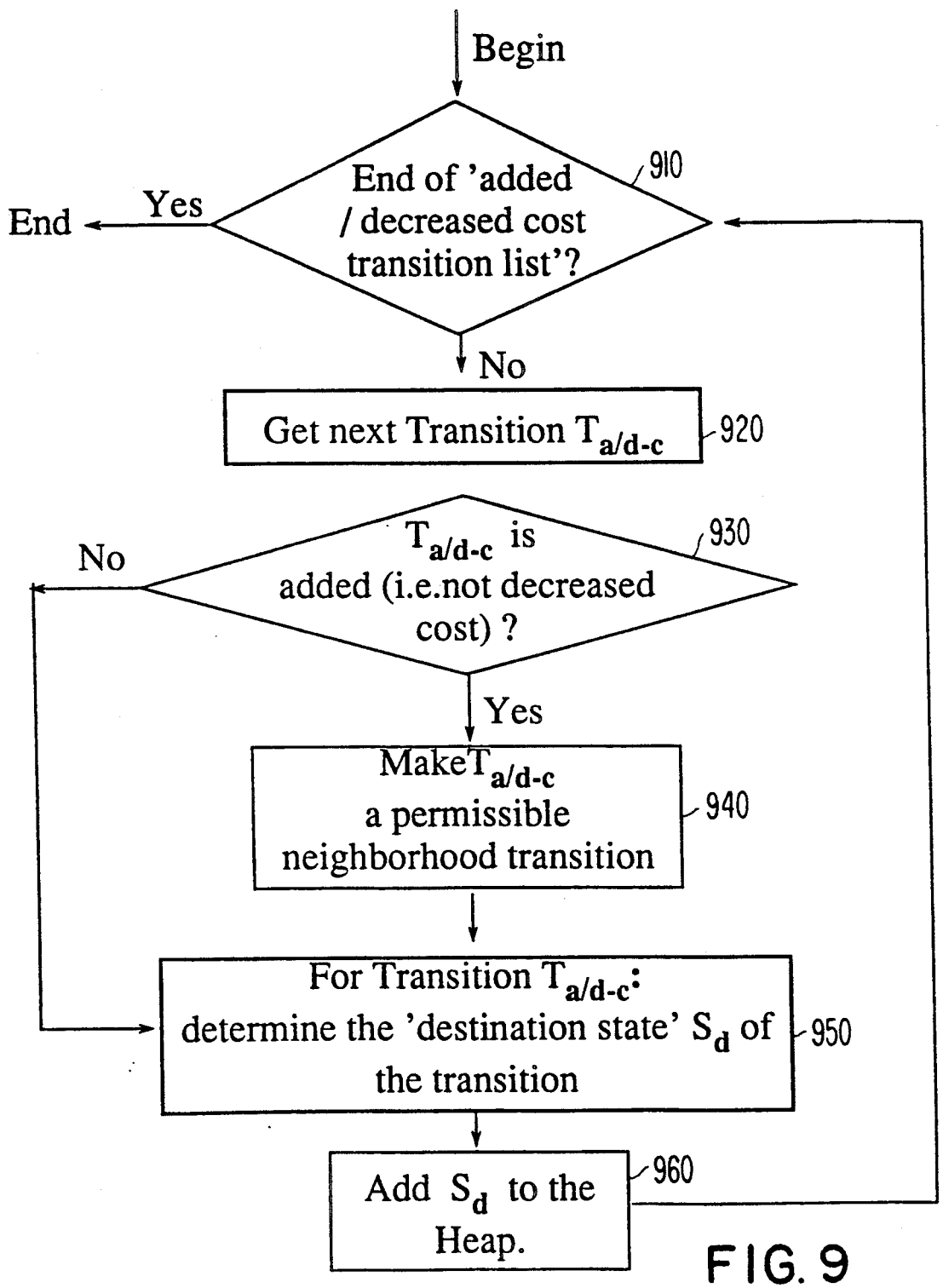
FIG. 9 is a flowchart giving more details of box 780 from FIG. 7.

FIG. 9 gives more details of box 780 of FIG. 7, in other words of how to handle added (or decreased-cost transitions). In box 910, the method tests whether the end of the 'added/decreased cost transition list' has been reached. If the results of box 910 are negative, the method gets the next transition $T_{a/d-c}$ at box 920. At box 930, the method tests whether $T_{a/d-c}$ is an added (i.e. not decreased) cost. If the results of test of box 930 are positive, control passes to box 940, where $T_{a/d-c}$ is made a permissible neighborhood transition. At box 950, the method determines the 'destination state' Sd of the transition $T_{a/d-c}$. Thereafter, $S_d$ is added to the heap at box 960 and control is returned to box 910. If the result of the test of box 930 is negative control passes directly from box 930 to box 950. If the result of the test of box 910 is positive, box 780 ends.

Simplified Examples

Figure 11A:
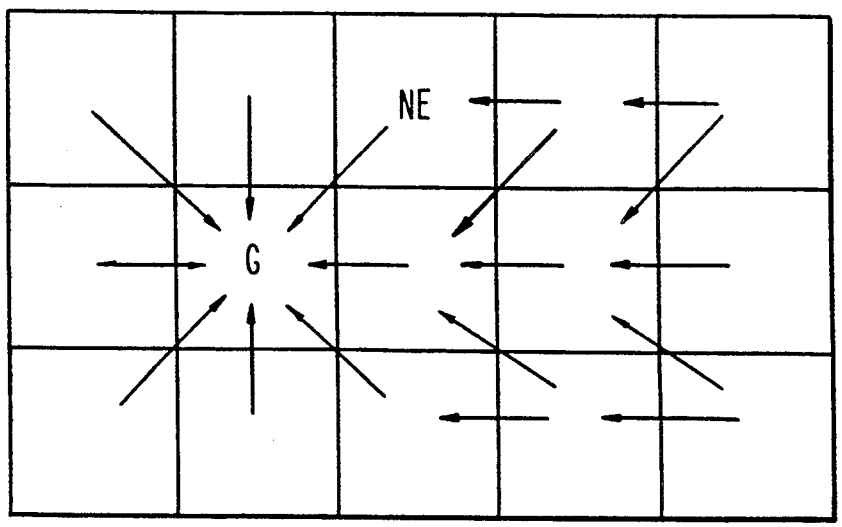
FIG. 11a shows a small configuration space with a particular transition called NE-to-G.

FIG. 11a shows a simple 5×3 graph with direction arrows corresponding to local motions using neighborhoods with eight neighbors. The graph has been 'budded' to produce a solution graph. Following the direction_arrows values, or transitions, will lead to the goal state G. The optimality criterion used in this case is the Euclidean distance.

Figure 11B:
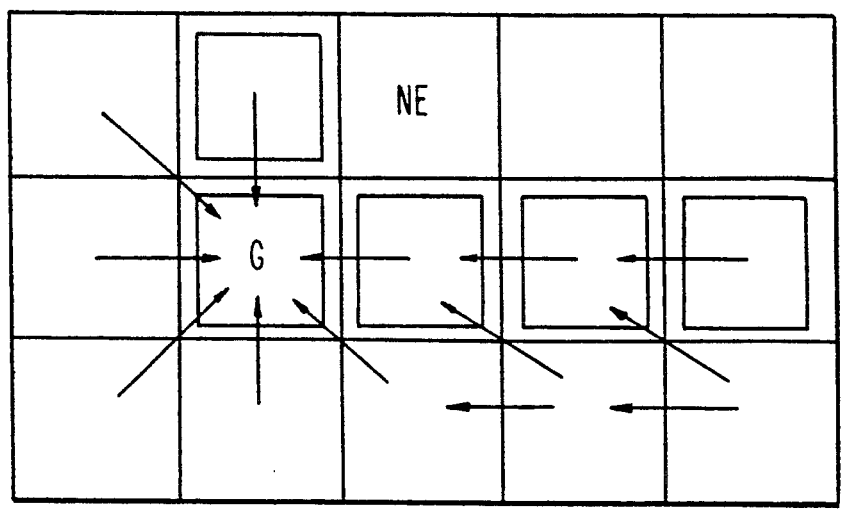
FIG. 11b shows the configuration space of FIG. 11a with the transition NE-to-G removed.
Figure 11C:
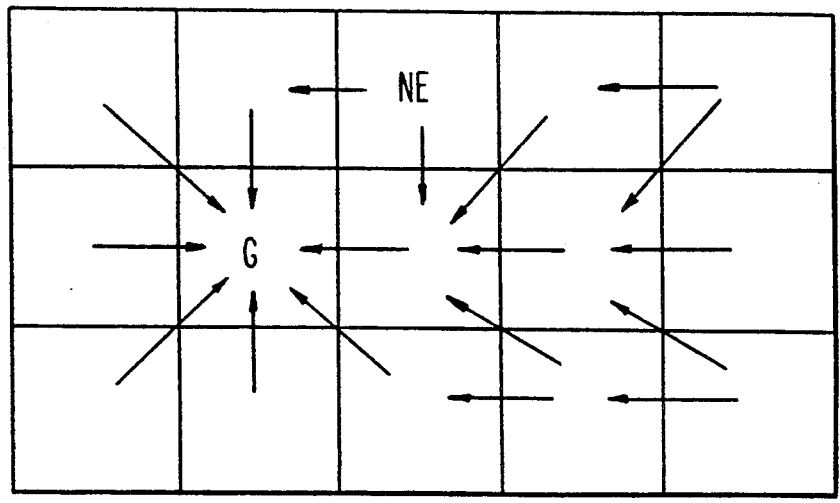
FIG. 11c shows the configuration space of FIG. 11b, with transition costs recalculated.

Suppose the transition from the northeast neighbor to the goal is newly forbidden. The 'destination state' is the goal, G, in this example, and the 'source state' is the northeast state, NE. The following steps will readjust the configuration space: First, the eligibility of the inter-neighbor transition from NE-to-G is removed. In other words, when budding, the NE neighbor would not be evaluated from G. Second, the source state NE is added to the 'obstacle list' (but after the obstacle states are initialized) and follows the same treatment as obstacle states. The direction arrows and cost_to_goal values dependent on NE are cleared by the 'clear-influence' method 120. The configuration space is shown in FIG. 11(b) with removed NE to g transition, cleared states, and a perimeter list, shown by boxes. Budding begins from the perimeter list giving the results shown in FIG. 11c.

Figure 12:
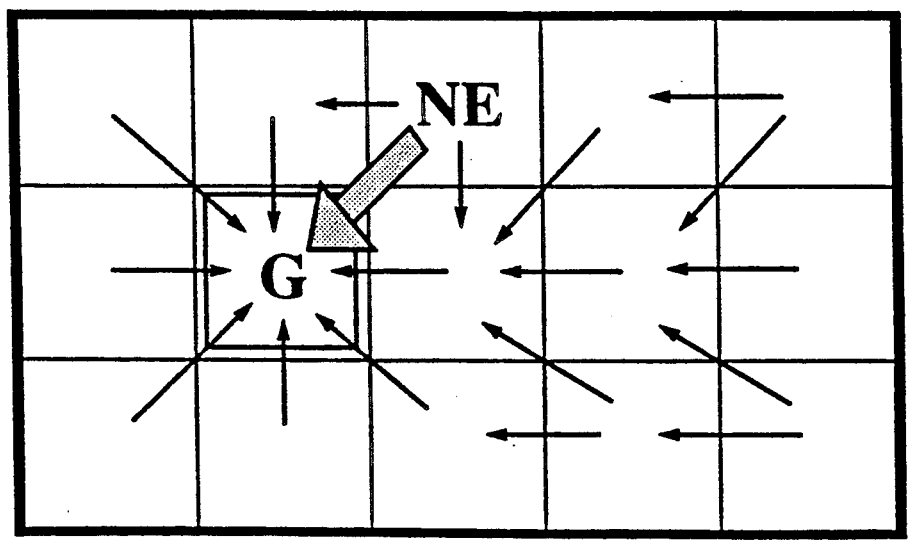
FIG. 12 shows the configuration space of FIG. 11c with the transition NE-to-G re-added.

If the transition from NE to G is re-added, see FIG. 12, and the method of FIG. 9 is applied, the configuration space returns to the situation of FIG. 11a.

We claim:

1. A method for controlling an object to follow a path comprising the steps of:
   a) maintaining a stored configuration space having cost to goal and direction arrow values indicating the path or absence thereof from at least one state in the configuration space to at least one goal state in the configuration space;
   b) receiving data indicating a change in a transition between states in the configuration space; and
   c) differentially updating the configuration space to reflect the change, so that at least one cost to goal or one direction arrow value is changed; and
   d) controlling the object to follow a path indicated by the undated configuration space.

2. A method for controlling an vehicle to follow a path comprising the steps of:
   a) maintaining a stored configuration space having cost to goal and direction arrow values indicating the path of absence thereof from at least one state in the configuration space to at least one goal state in the configuration space, which configuration space represents traffic conditions on a plurality of streets;
   b) receiving data indicating a change in a transition between states in the configuration space, which change represents a change in traffic conditions in one lens of one of the plurality of streets;
   c) differentially updating the configuration space to reflect the change, so that at least one cost to goal or one direction arrow value is changed; and
   d) controlling the vehicle to follow a path indicated by the updated configuration space.

* * * * *